INVENTORS H. C. CASEY, JR.
M. B. PANISH
BY [signature]
ATTORNEY

Dec. 23, 1969 H. C. CASEY, JR., ET AL 3,485,685

METHOD AND SOURCE COMPOSITION FOR REPRODUCIBLE DIFFUSION OF ZINC INTO GALLIUM ARSENIDE

Filed May 31, 1967 2 Sheets-Sheet 2

United States Patent Office 3,485,685
Patented Dec. 23, 1969

3,485,685

METHOD AND SOURCE COMPOSITION FOR REPRODUCIBLE DIFFUSION OF ZINC INTO GALLIUM ARSENIDE

Horace C. Casey, Jr., New Providence, and Morton B. Panish, Springfield, N.J., assignors to Bell Telephone Laboratories, Incorporated, Murray Hill, N.J., a corporation of New York Filed May 31, 1967, Ser. No. 642,444
Int. Cl. H01l 7/44
U.S. Cl. 148—189 1 Claim

ABSTRACT OF THE DISCLOSURE

This specification describes a method for reproducible zinc diffusion into gallium arsenide. The essence of the method is the use of a ternary Zn-As-Ga diffusion source. If the composition is properly chosen the source forms an equilibrium mixture of three condensed phases below 744° C. These condensed phases include gallium arsenide. The gallium arsenide substrate is therefore initially in equilibrium with the source during diffusion except in that it does not yet contain the equilibrium zinc concentration. As a result of the number of phases present in the equilibrium source, the vapor pressures of zinc and arsenic (which parameters dictate the diffusion behavior in this system), are independent of the composition of the source material as long as the temperature is controlled, and the source composition is within a particular composition range. The method gives steep and uniform diffusion profiles with good reproducibility and a planar junction interface.

This invention relates to methods for diffusing zinc, a p-type dopant, into gallium arsenide.

Zince is a standard acceptor or p-type impurity in gallium arsenide. The various prior art techniques for diffusing zinc into gallium arsenide utilize, as a starting or source material, elemental zinc, dilute solutions of zinc in gallium, or various combinations of zinc and arsenic. For highly controlled, reproducible diffusion processes, it is important to approach a dynamic equilibrium between the source material and the gallium arsenide wafer and the system should not be sensitive to source composition changes. The phase relationships in the ternary system for zinc-gallium-arsenic show that while certain of these sources form condensed phases at the diffusion temperature, the condensed phase is deficient in one of the ternary components necessary to reach the equilibrium condition. As a consequence, the initial process in the diffusion is the dissolution of the gallium arsenide surface to supply the deficiency. When this occurs, control over the diffusion depth and diffusion rate becomes difficult. The use of these prior art diffusion sources often results in irregular diffusion profiles and nonuniform junctions. Sources containing As and Zn which completely vaporize at the diffusion temperature do not damage the surface but are difficult to control since very precise amounts of zinc and arsenic must be used in accurately controlled volumes.

According to this invention, certain prescribed Ga-As-Zn ternary compositions are employed as the source material in the diffusion process. These compositions form a region in the ternary phase diagram which is in equilibrium with gallium arsenide below 744° C. There is no liquid phase present in this region so that the partial pressures of all three components are fixed at a given temperature. Since the surface concentration and the diffusion coefficient for zinc into gallium arsenide depend on the partial pressures of Zn and $As_4$, the fact that these partial pressures are constant in this critical region suggests a highly reproducible diffusion source having the unobvious property of exhibiting identical diffusion behavior irrespective of composition within the region and of the total mass of source present. Diffusion profiles made with these ternary sources are very steep and extremely reproducible. In the drawing:

Figure 1:
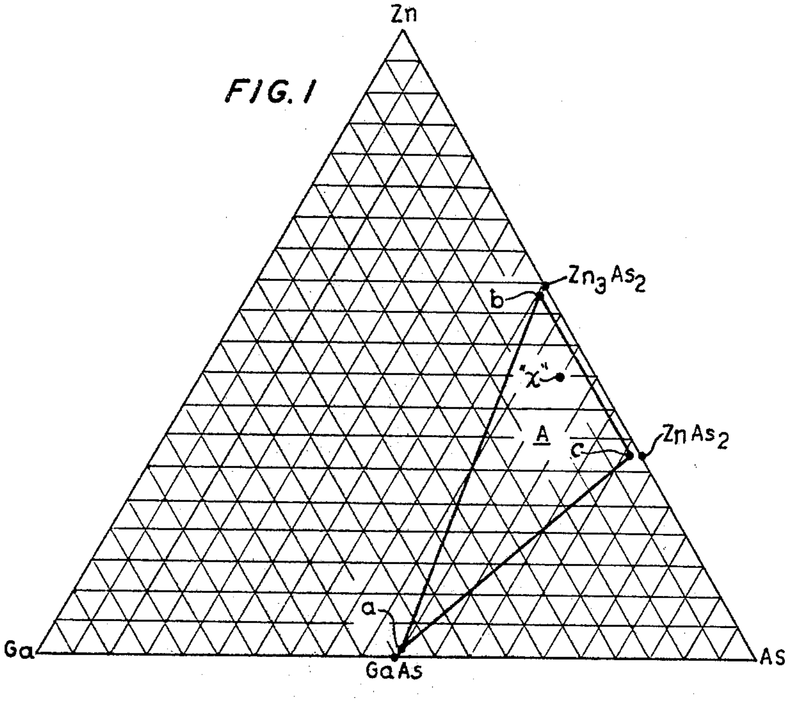
FIG. 1 is a ternary phase diagram for the system Zn-Ga-As at about 744° C.

The ternary phase isotherm for the Zn-Ga-As system at about 744° C. is shown in FIG. 1. The compositions for the diffusion sources that are within the scope of this invention are defined by the region "A" bounded by lines joining points *a*, *b*, and *c*. These points correspond to the following compositions:

Point *a*: 1% Zn, 49% Ga, 50% As
Point *b*: 59% Zn, 1% Ga, 40% As
Point *c*: 33% Zn, 1% Ga, 66% As All percentages are atomic percents.

This critical region is bounded by a line (*bc*) at 1 percent gallium since this quantity is sufficient to avoid damage to the gallium-arsenide wafer during long term diffusions by the loss of Ga to the source. The boundary point at *a*, corresponding to 1 percent zinc is considered to have a sufficient concentration of zinc to provide a useful zinc diffusion. Region A actually extends to, and is therefore in equilibrium with, gallium arsenide; however, gallium arsenide is obviously useless for the purpose of the invention and compositions having less than 1 percent zinc are not believed to be useful.

Figure 2:
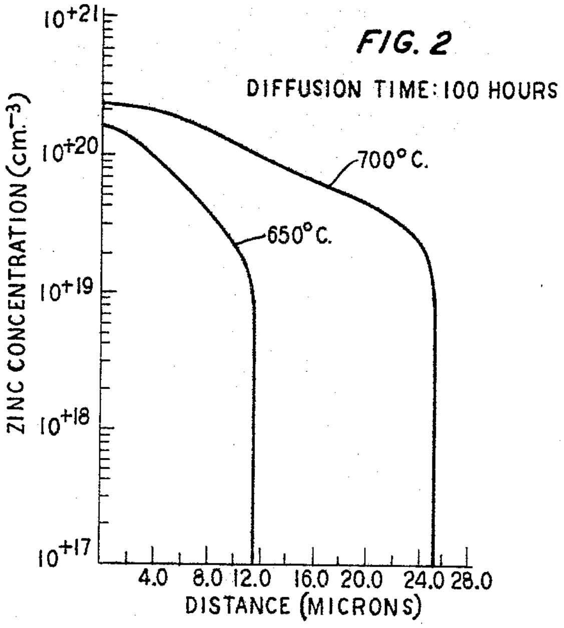
FIG. 2 is a plot of the diffusion profiles obtained with the ternary sources of this invention.

FIG. 2 illustrates typical diffusion profiles obtainable using ternary sources having compositions within the region A of the diagram of FIG. 1. The diffusion process used for obtaining these data is as follows:

The Ga, As, and Zn were used in proportions of 5, 50, 45 atomic percent, respectively. This source composition, which is identified as point *x* in the diagram of FIG. 1, requires 0.10 g. GaAs, 0.48 g. As, and 0.42 g. Zn per gram of source material. The Ga, as semiconductor grade GaAs, was added to the required amounts of semiconductor grade As and Zn in fused silica capsule with one-eighth inch thick walls. The capsule was evacuated to a pressure of approximately $10^{-5}$ torr, sealed and then slowly heated to 900° C. (Reducing the pressure below $10^{-5}$ torr insures that enough air is removed so that insufficient oxygen will be present to react appreciably with the source.) Fairly rapid cooling of the source mixture was achieved by pulling the capsule rapidly out of the oven. It should be noted that precautions must be taken to prevent explosions which may occur during preparation of the source. To reduce possibilities of explosions, GaAs was used instead of Ga to prevent an exothermic reaction between As and Ga, the fused silica cell had a volume at least five times that of the sample, and heating between 650° C. and 820° C. was done at 10°/h. maximum. A protective screen was used when removing the hot capsule from the oven. The resulting Ga-As-Zn ingot was sandblasted and washed ultransonically to clean the surface, then was cut into approximately one-eighth inch cubes. The cube size is convenient for handling and permits a reasonable surface area for a given source weight by using several pieces for each wafer diffused.

The samples used to determine the diffusion properties of the Ga-As-Zn source were single-crystal, <100> oriented, Te-doped, floating-zone wafers. The electron concentration in the samples varied between 0.2 and $8 \times 10^{18}$ cm.$^{-3}$ and the samples were polished to provide a damage-free surface with a bromine-methanol etch, as described in U.S. Patent 3,156,596, issued Nov. 10, 1964. A single wafer with approximately a 0.250 inch diameter and 0.020 inch thickness was sealed in a fused silica ampoule along with the source material. Source and sample were separated by slightly necking down the 10 mm. (inside diameter) quartz tubing near the sealed end. The ampoules were evacuated with a mechanical pump to a pressure of about $10^{-2}$ torr and sealed at a length of 2 inches or less. Pressures below 1 torr are desirable in terms of reducing oxidation of the gallium arsenide surface although a reduced pressure is not considered essential. With this ampoule volume and sample size, the weight of the source material was varied between 16 mg. and 300 mg. with no observable differences in junction depth. Cleaning prior to sealing consisted of washing in organic solvents and methanol.

Numerous diffusions were made at 650° and 700° C. for times ranging from a few hours to 100 hours. To prevent surface damage to the sample by vapor transport, the temperature must be uniform throughout the entire length of the ampoule. Since junction depth depends on temperature, reproducible results require a constant temperature furnace. Finally, to prevent deposit of the vapor on the sample surface during cool-down, the source end of the ampoule should be rapidly cooled (such as held by wet asbestos) upon withdrawal from the furnace.

The concentration of Zn at the surface and the diffusion profile for Zn concentration above $2 \times 10^{19}$ cm.$^{-3}$ were measured by electron beam microanalysis with a Cambridge Instruments Microscan. The diffusion profile for concentrations below $2 \times 10^{19}$ cm.$^{-3}$ was obtained by angle lapping and staining to obtain the depth at which the Zn concentration equals the known electron concentration. The samples used for microanalysis were diffused for 100 hours at 650° C. and 700° C. and washed in HCl to remove any condensed Zn from the surface. Then, the wafers were cut in half to expose the diffused layer so that the Zn concentration varies with distance from the original surface, but is uniform in depth from the cut surface. The two halves were butted together and the cut surface polished to give exposed and symmetrical Zn layers on each side of the interface between the two halves.

In the X-ray analysis the electron beam is initially positioned in the n-type region to determine the background emission, and then slowly scans acorss one Zn-diffused layer to the interface and across the other Zn-diffused layer. The micron diameter, 40 kv. electron beam strikes the surface of the sample, penetrates approximately $4_{\mu}$, and the excites characteristic X-rays whose intensity is recorded. The ratio of the intensity of the Zn-$K_{\alpha}$ line emitted by Zn in the GaAs, less the background (Bremsstahlung) radiation, to that emitted by a pure Zn sample less background, is a measure of the amount of Zn in the GaAs. This ratio is divided by 1.3 to account for the Zn-$K_{\alpha}$ emission which is excited by absorption of the $K_{\alpha}$ line of As and the $K_{\beta}$ lines of both As and Ga. The corrected intensity ratio, when multiplied by the number of Zn atoms per cm.$^3$ in pure Zn gives the Zn concentration in the GaAs.

The 100 hours diffusion profiles for 650° C. and 700° C. obtained by electron-beam microanalysis (microprobe) and junction staining are shown in FIG. 2. Surface concentrations of $1.6 \times 10^{20}$ cm.$^{-3}$ at 650° C. and $2.4 \times 10^{20}$ cm.$^{-3}$ at 700° C. were obtained. It is evident from FIG. 2 that the profiles are very steep and the junction junction-depth does not depend on the initial electron concentration.

Figure 3:
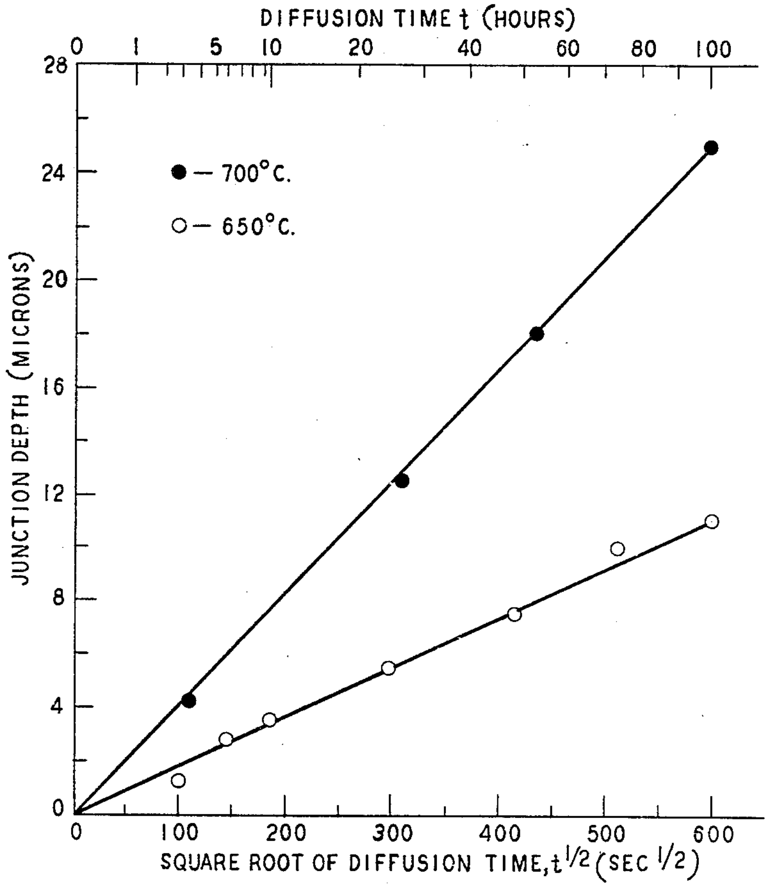
FIG. 3 is a plot of the junction depth as a function of time at two exemplary temperatures.

Diffusion time at both 650° C. and 700° C. was varied in order ot permit selection of the required time for a desired junction depth. The resulting variation of junction-depth with time is shown in FIG. 3. The junction-depth was found to vary as the square root of time.

As indicated previously, all compositions within the region A will behave in a similar manner if the temperature is controlled and remains below 744° C. The minimum useful temperature is established by the length of time desired for the process. Below 500° C. the diffusion rate is quite slow although the high degree of control over junction-depth and uniform junction interface remains. For shallow junction devices low diffusion temperatures may be desirable, especially if diffusion times of the order of 100 hours can be tolerated. Other considerations in semiconductor processing such as the impairment of the diffusion mask, the thermal effects of a second diffusion in a double diffusion process, the usual deterioration of control, introduction of copper contamination, and other consequences of high temperature diffusion suggest that low temperature processing is desirable. The prior art zinc diffusion methods typically employ temperatures in excess of the 744° C. limit imposed on the process of this invention.

Semiconductor devices made with junctions prepared according to this invention can be used as electroluminescent diodes, Impatt diode oscillators, varactors, switching diodes, laser modulators and for several other applications now being considered for gallium arsenide devices.

Various additional modifications and extensions of this invention will become apparent to those skilled in the art. All such variations and deviations which basically rely on the teachings through which this invention has advanced the art are properly considered within the spirit and scope of this invention.

What is claimed is:

1. A method for diffusing zinc into a gallium arsenide wafer comprising the steps of providing in a diffusion chamber, a gallium arsenide wafer and a diffusion source having a composition falling within an area *a*, *b*, *c* in the gallium-arsenic-zinc ternary phase diagram bounded by the following points:

*a*: 1% Zn, 49% Ga, 50% As
*b*: 59% Zn, 1% Ga, 40% As
*c*: 33% Zn, 1% Ga, 66% As (where the quantities given are in atom percent) sealing the chamber, and heating the chamber to a temperature between 500° C. and 744° C. for a period sufficient to diffuse the desired amount of zinc into the gallium arsenide substrate.

References Cited

UNITED STATES PATENTS 3,305,412 2/1967 Pizzarello ---------- 148—189

L. DEWAYNE RUTLEDGE, Primary Examiner

R. A. LESTER, Assistant Examiner

U.S. Cl. X.R.

148—190; 252—62.3; 317—237